(12) United States Patent
Ivanov et al.

(10) Patent No.: US 11,251,759 B2
(45) Date of Patent: Feb. 15, 2022

(54) OPERATIONAL AMPLIFIER INPUT STAGE WITH HIGH COMMON MODE VOLTAGE REJECTION

(71) Applicant: Texas Instruments Incorporated, Dallas, TX (US)

(72) Inventors: Vadim Valerievich Ivanov, Dallas, TX (US); Srinivas Kumar Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 31 days.

(21) Appl. No.: 16/777,521

(22) Filed: Jan. 30, 2020

(65) Prior Publication Data

US 2021/0242844 A1 Aug. 5, 2021

(51) Int. Cl.
*H03F 3/45* (2006.01)

(52) U.S. Cl.
CPC ... *H03F 3/45076* (2013.01); *H03F 2200/375* (2013.01)

(58) Field of Classification Search
CPC ............. H03F 3/45183; H03F 3/45179; H03F 3/45192; H03F 3/45188; H03F 3/45475; H03K 2217/0018; H03K 19/0016; H03K 19/00384; G05F 3/205; G11C 5/146
USPC .................. 327/534, 560–563; 330/252–253
See application file for complete search history.

(56) References Cited

U.S. PATENT DOCUMENTS

| | | | |
|---|---|---|---|
| 5,786,724 A | 7/1998 | Teggatz | |
| 5,854,569 A * | 12/1998 | Kohno | G05F 3/242 327/543 |
| 6,133,799 A | 10/2000 | Favors, Jr. et al. | |
| 6,392,490 B1 | 5/2002 | Gramegna et al. | |
| 6,407,623 B1 | 6/2002 | Bazarjani et al. | |
| 6,956,434 B2 | 10/2005 | Gupta | |
| 7,733,157 B2 | 6/2010 | Brederlow et al. | |
| 7,796,073 B2 * | 9/2010 | Ogawa | H03K 17/302 341/144 |
| 9,224,324 B2 | 12/2015 | Nadiguebe et al. | |
| 9,519,304 B1 | 12/2016 | Far | |
| 10,396,729 B2 * | 8/2019 | Iwamoto | H03F 3/45192 |
| 2005/0231284 A1 * | 10/2005 | Adachi | H03F 3/45192 330/255 |
| 2007/0247227 A1 * | 10/2007 | Zhang | H03F 1/083 330/253 |

* cited by examiner

*Primary Examiner* — Quan Tra
(74) *Attorney, Agent, or Firm* — Michael T. Gabrik; Charles A. Brill; Frank D. Cimino

(57) ABSTRACT

An apparatus has four transistors. The first and third transistors each have a gate coupled to a first input terminal and second input terminal respectively, a source coupled to a current source and to a first terminal of a bias voltage source, and a substrate coupled to a second terminal of the bias voltage source. The second and fourth transistors each have a gate coupled to the first input terminal and the second input terminal respectively, a source coupled to the drain of the first and third transistors respectively, a drain coupled to a lower voltage supply and a substrate coupled to its source. The bias voltage source increases the threshold voltages of the first and third transistors above the second and fourth transistors, respectively. This ensures that the first and third transistors turn on after the second and fourth transistors, respectively.

19 Claims, 2 Drawing Sheets

# OPERATIONAL AMPLIFIER INPUT STAGE WITH HIGH COMMON MODE VOLTAGE REJECTION

BACKGROUND

If a signal is applied to both inputs of an operational amplifier (op amp) operating in differential mode, the output should not respond to that input because the differential input voltage between the inputs is unchanged. In practice however, changes to the common mode input voltage may produce an undesired change in the op amp output. The common mode rejection ratio (CMRR) of a differential amplifier is a measure of the op amp's ability to reject common-mode input signals.

Common mode input signals are those that appear simultaneously and in-phase on both inputs. An ideal differential amplifier would have infinite CMRR. However, having an infinite CMRR is generally considered to be unachievable in practice. Common mode input signals can produce an undesired output offset voltage error in op amps. Therefore, a high CMRR is desirable to reduce the effects of common mode voltage inputs.

SUMMARY

Disclosed embodiments include an input stage for a differential amplifier including six transistors. The first transistor has a gate coupled to a first input terminal, a source coupled to a current source, and a substrate coupled to a bias voltage terminal. The second transistor has a gate coupled to the first input terminal and a source coupled to the drain of the first transistor. The third transistor has a gate coupled to a second differential input terminal, a source coupled to the current source, and a substrate coupled to the bias voltage terminal. The fourth transistor has a gate coupled to the second differential input terminal and a source coupled to third transistor's drain. The fifth transistor has a gate coupled to the first differential input terminal and a source coupled to a resistor. The sixth transistor has a gate coupled to the second differential input terminal and a source coupled to a resistor.

A second embodiment disclosed includes an input stage for a differential amplifier with four transistors. The first and third transistors each have a gate coupled to a first input terminal and second input terminal respectively, a source coupled to a current source and to a first terminal of a bias voltage source, and a substrate coupled to a second terminal of the bias voltage source. The second and fourth transistors each have a gate coupled to the first input terminal and the second input terminal respectively, a source coupled to the drain of the first and third transistors respectively, a drain coupled to a lower voltage supply and a substrate coupled to its source. The bias voltage source increases the threshold voltages of the first and third transistors above the second and fourth transistors, respectively. This ensures that the first and third transistors turn on after the second and fourth transistors, respectively.

A third embodiment disclosed includes a process including receiving a first input signal at the base of a first transistor and the base of a second transistor, coupling the source terminal of the second transistor to the drain terminal of the first transistor, increasing the threshold voltage of the first transistor by coupling a bias voltage source between the substrate and the source terminal of the first transistor, coupling the substrate of the second transistor to the emitter of the second transistor, and transmitting a first output signal from the drain terminal of the second transistor.

The voltage across the bias voltage source is chosen to ensure that the first transistor has a higher threshold voltage than the second transistor. The purpose for ensuring that the first transistor has a higher threshold voltage that the second transistor is to ensure that the second transistor turns on before the first transistor, even though the first transistor and the second transistor share a common gate input.

The disclosed embodiments advantageously use the body effect of transistors. The disclosed embodiments employ the body effect by connecting a bias voltage source across the source and substrate of one transistor in a cascade configuration while coupling the source and substrate of the other transistor in the cascade pair. Applying this bias voltage between the source and substrate of one transistor and not the other transistor creates a difference in the threshold voltages of the two transistors. It is this difference in the threshold voltage that ensures proper self-cascoding.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

The industry standard for common mode voltage range in operational amplifiers is to be able to go beyond rail-to-rail voltage to an upper bonus range above the upper rail voltage and to a lower bonus range below the lower rail voltage. In at least one case, the upper and lower bonus ranges may be anywhere from 0V to approximately 100 mV above and below the upper rail and lower rail voltages, respectively. In other cases, the upper and lower bonus ranges could be between 0V and 25 mV above and below the upper rail and lower rail voltages, respectively. The upper bonus range could be approximately the same as the lower bonus range, or the upper bonus range could be different than the lower bonus range.

Figure 1:
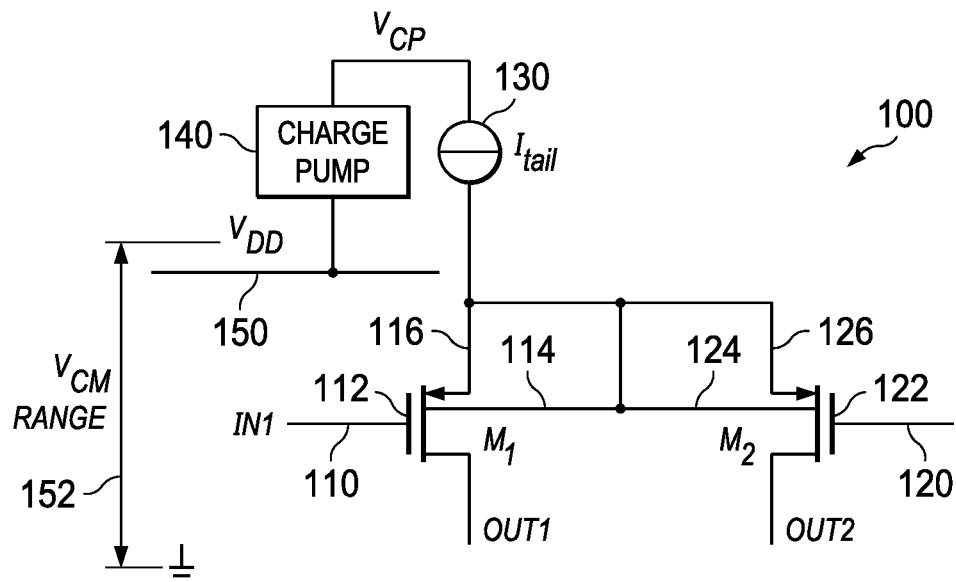
FIG. 1 shows a typical input stage for a standard operational amplifier.

FIG. 1 shows a typical input stage 100 for an industry standard operational amplifier. IN1 110 and IN2 120 are the inputs for a differential amplifier. IN1 110 is the gate input for transistor M1 112 and IN2 120 is the gate input for transistor M2 122. The body 114, which is a term that is interchangeable with the term substrate, of transistor M1 112 is coupled to the body 124 of transistor M2 122 in this example.

The source 116 of M1 112 is electrically connected to the body 114 of M1 112. The source 126 of M2 122 is electrically connected to the body 124 of M2 122. When the source and the body of a transistor are connected together, the transistor can be described as being connected locally. Therefore, M1 112 and M2 122 are each connected locally. The source 116 of M1 112 and the source 126 of M2 122 are each also connected to a current source 130, which provides the current necessary for biasing transistors M1 112 and M2 122 to operate in the saturation range. The current source 130 is fed by a charge pump 140 that is supplied by a voltage source $V_{DD}$ 150. The charge pump 140 is needed because the current source 130 requires a voltage higher than $V_{DD}$ 150 in order to support a common mode voltage range outside the upper and lower rail voltages. The charge pump 140 outputs a voltage $V_{CP}$ that could in some cases be around 200 mV higher than the gate to source voltage, $V_{GS}$, of M1 112. In other cases, the output voltage $V_{CP}$ of the charge pump 140 could be anywhere in a range from 50 mV to 500 mV higher than $V_{GS}$ of M1 112.

To improve the common mode rejection ratio (CMRR) of the amplifier, the drain to source voltages of M1 112 and M2 122, the gate to source voltages of M1 112 and M2 122, and the current from the current source 130 should each remain constant throughout the full common mode voltage range 152. Any changes in these parameters will result in an offset voltage error. It is desirable that the output voltage has only a small change when the common mode voltage changes, because any changes in the output results in an error in the output voltage. Therefore, minimizing any change to the drain to source voltages of M1 112 and M2 122, the gate to source voltages of M1 112 and M2 122, and the current from the current source 130 will have the result of minimizing the offset voltage error. If the output offset voltage did not change at all, then the CMRR would be infinite.

To reduce the change in drain to source voltage of transistors M1 112 and M2 122, and therefore reduce the change in output offset voltage, two transistors having lower threshold voltages than M1 112 and M2 122 can be added to the circuit in a self-cascoding configuration. This is shown in FIG. 2.

Figure 2:
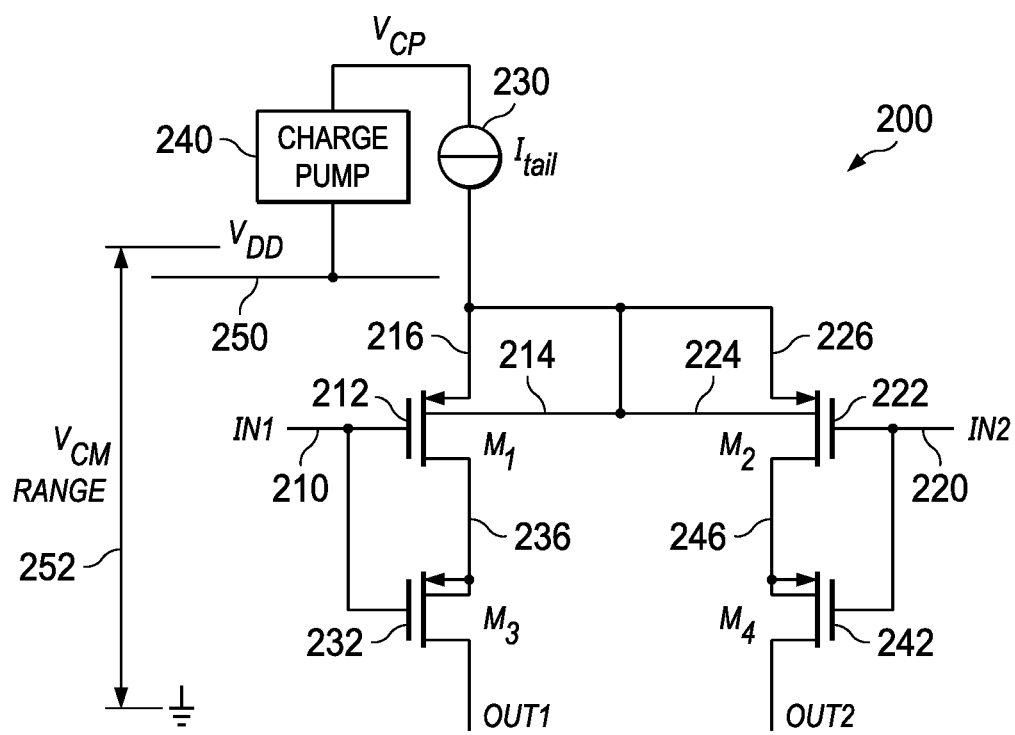
FIG. 2 shows a self-cascoding input stage for an operational amplifier.

FIG. 2 shows a typical input stage 200 for an operational amplifier with a self-cascoding input stage. IN1 210 and IN2 220 are the inputs for a differential amplifier. IN1 210 is the gate input for transistor M1 212 and IN2 220 is the gate input for transistor M2 222. The body 214 of transistor M1 212 is coupled to the body 224 of transistor M2 222.

The source 216 of M1 212 is electrically connected to the body 214 of M1 212. The source 226 of M2 222 is electrically connected to the body 224 of M2 222. Therefore, M1 212 and M2 222 are each connected locally. The source 216 of M1 212 and the source 226 of M2 222 are each also connected to a current source 230, which provides current necessary for biasing transistors M1 212 and M2 222. The current source 230 is fed by a charge pump 240 that is supplied by a voltage source $V_{DD}$ 250. The charge pump 240 is necessary because the current source 230 requires a voltage higher than $V_{DD}$ 250 in order to support a common mode voltage range outside the upper and lower rail voltages. The charge pump 240 outputs a voltage $V_{CP}$ that could in some cases be around 200 mV higher than the gate to source voltage, $V_{GS}$, of M1 212. In other cases, the output voltage $V_{CP}$ of the charge pump 240 could be anywhere in a range from 50 mV to 500 mV higher than $V_{GS}$ of M1 212.

The drain 236 of M1 212 is coupled to the source of transistor M3 232. The gates of M1 212 and M3 232 are coupled to one another, and are also coupled to amplifier input IN1 210. Similarly, the drain 246 of M2 222 is coupled to the source of transistor M4 242. The gates of M2 222 and M4 242 are coupled to one another and are also coupled to amplifier input IN2 220. The drain of M3 232 is coupled to output terminal OUT1 and the drain of M4 242 is coupled to output terminal OUT2.

In at least some cases, M3 232 and M4 242 have lower threshold voltages than M1 212 and M2 222 to ensure that M1 212 and M2 222 have adequate drain to source voltage to keep them operating in the saturation region. One way to ensure M1 212 and M2 222 operate in saturation is to ensure that M3 232 turns on before M1 212 and M4 242 turns on before M2 222 even though their gates are tied together. In at least some cases, the threshold voltages of M1 212 and M2 222 may be in the range from 0.6 V to 0.7V, while the threshold voltages of M3 232 and M4 242 may be closer to 0.5 V or even less. The difference in threshold voltage between the input device of FIG. 1 and a device in a cascoding configuration as in FIG. 2 should be larger enough to ensure the device operates in the saturation region and not in the triode region. In many cases, this voltage difference may be in the range from 200 mV to 250 mV. If the transistors begin to operate in the triode region, the resistance through the transistor will increase, causing the current through the transistor to decrease. This will result in the voltage at the drain of the transistors dropping. When this happens, the transistor current gain decreases and the error due to electrical noise increases. As a result, the accuracy of the amplifier decreases.

Figure 3:
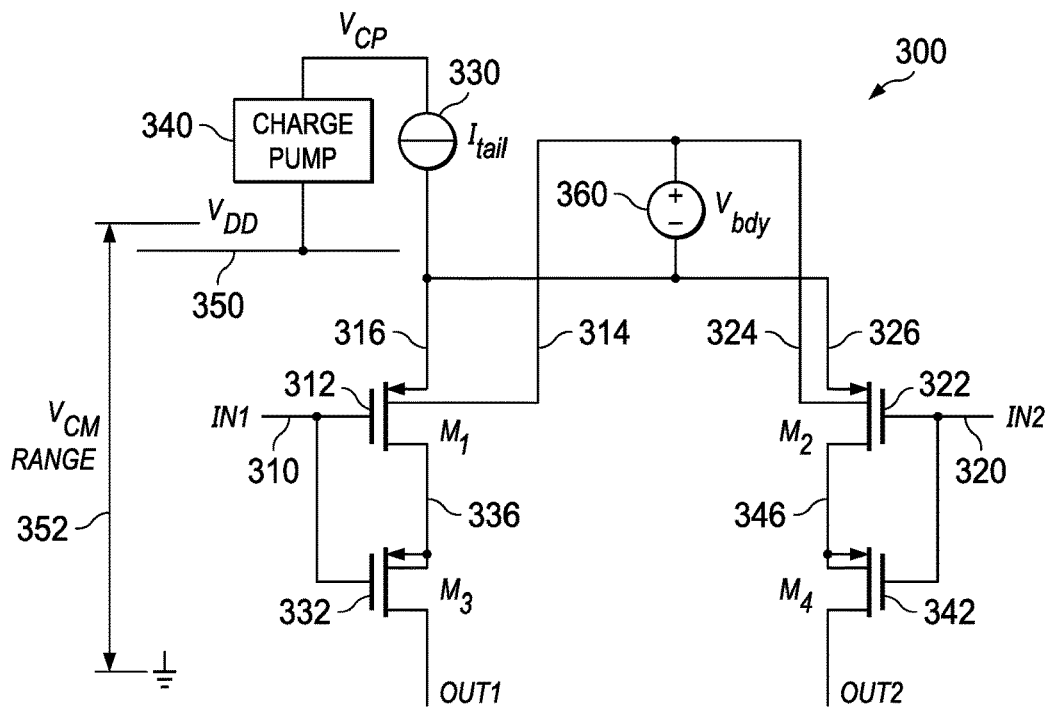
FIG. 3 shows an example input stage for an operational amplifier employing the body effect.

Transistors with a lower threshold voltage may not be available in the desired semiconductor fabrication process, or the achievable difference in threshold voltage between M1/M2 and M3/M4 may not be sufficient to keep M1 212 and M2 222 operating in the saturation region and not in the triode region. FIG. 3 illustrates an alternative embodiment that does not require transistors with a lower threshold voltage, but instead employs the body effect found in MOSFET transistors to alter the transistor threshold voltage.

Body effect refers to the change in the transistor threshold voltage resulting from a voltage difference between the source terminal and the body of the transistor. Because the voltage difference between the source and the body affects the threshold voltage in a manner similar to how the voltage difference source and the gate of a transistor, the body can be thought of as a second gate terminal that influences the voltage at which the transistor turns on and off.

FIG. 3 shows an input stage 300 for an operational amplifier operating in differential mode. IN1 310 and IN2 320 are the inverting and noninverting inputs for a differential amplifier. IN1 310 is a gate input for transistor M1 312 and IN2 320 is a gate input for transistor M2 322. The body 314 of transistor M1 312 is coupled to the body 324 of transistor M2 322. The bodies 314 and 324 are also coupled to the positive terminal of a voltage source, $V_{bdy}$ 360 that provides a bias voltage for the body 314 of transistor M1 312 and the body 324 of transistor M2 322.

The source 316 of M1 312 is electrically connected to the source 326 of M2 322. Unlike in the example of FIG. 2, the source 316 of M1 312 and the source 326 of M2 322 are not connected locally to their respective bodies, 314 and 324. Instead, the source 316 of M1 312 and the source 326 of M2 322 are coupled to the negative terminal of $V_{bdy}$ 360. The source 316 of M1 312 and the source 326 of M2 322 are each also tied to a current source 330, which provides the current necessary for biasing transistors M1 312 and M2 322 to ensure that they remain operating in the saturation region. The current source 330 is fed by a current mode charge pump 340 that is supplied by a voltage source $V_{DD}$ 350. The charge pump 340 is necessary because the current source 330 requires a voltage higher than $V_{DD}$ 350 in order to support a common mode voltage range outside the upper and lower rail voltages. The charge pump 340 outputs a voltage $V_{CP}$ that could in some cases be around 200 mV higher than the gate to source voltage, $V_{GS}$, of M1 312. In other cases, the output voltage $V_{CP}$ of the charge pump 340 could be anywhere in a range from 50 mV to 500 mV higher than $V_{GS}$ of M1 312.

The drain 336 of M1 312 is coupled to the source of transistor M3 332. The gates of M1 312 and M3 332 are coupled and are also coupled to amplifier input IN1 310. Similarly, the drain 346 of M2 322 is coupled to the source of transistor M4 342. The gates of M2 322 and M4 342 are coupled and are also coupled to amplifier input IN2 320. The drain of M3 332 is coupled to output terminal OUT1 and the drain of M4 342 is coupled to output terminal OUT2.

In contrast to the circuit of FIG. 2, transistors M3 332 and M4 342 can have the same inherently designed threshold voltage as transistors M1 312 and M2 322 in this circuit. In this example, it is not necessary to use transistors fabricated with a lower threshold voltage for M3 332 and M4 342 than for M1 312 and M2 322 due to the biasing of the bodies of transistors M1 312 and M2 322 by the voltage from $V_{bdy}$ 360, thus employing the body effect to increase the threshold voltage of M1 312 and M2 322. This provides the needed difference in threshold voltage between M1 and M3, and between M2 and M4. However, lower threshold voltage transistors may still be used for M3 332 and M4 342 as they were in the example of FIG. 2 if that is desired even though they are not required by this design due to employing the body effect for M1 312 and M2 322 to increase their threshold voltage.

The two terminals of the voltage source $V_{bdy}$ 360 are coupled across the body and source of transistors M1 312 and M2 322. This creates a voltage difference between the source and the body of M1 312 and of M2 322. The voltage at $V_{bdy}$ 360 is chosen to ensure operation of M1 312 and M2 322 in the saturation region, rather than allowing it to operate in the triode region. Increasing the body voltage $V_{bdy}$ 360 decreases the threshold voltage, but the decrease in threshold voltage is not a one-for-one relationship. The relationship is expressed by the equation $\delta V_{th} = \gamma V_{bdy}$. The value of the constant $\gamma$ may in some cases be in the range from 0.1 to 0.2, but in other cases the value of the constant $\gamma$ could be in a wider range from 0.05 to 0.5. This means that every mV of decrease in the threshold voltage for M1 312 and M2 322 requires an increase in $V_{bdy}$ 360 of $1/\gamma$ mV.

In one example, $V_{bdy}$ 360 may have a value of 0.5 V to 1.3 V depending upon the value of $\gamma$. It is desirable that the value of $\gamma$ be the same for M1 312 as it is for M2 322 throughout the full common mode input voltage range. One way to help accomplish this is to use the same charge pump for both. The output voltage of the charge pump $V_{CP}$ needs to increase by the value of $V_{bdy}$ in addition to the voltage that it already supplies, which in some cases may be in the range from 1.1 to 1.3V. The charge pump 340 may not be sufficient alone to supply this voltage under some conditions. Therefore, the addition of a separate charge pump could be advantageous in some cases.

Figure 4:
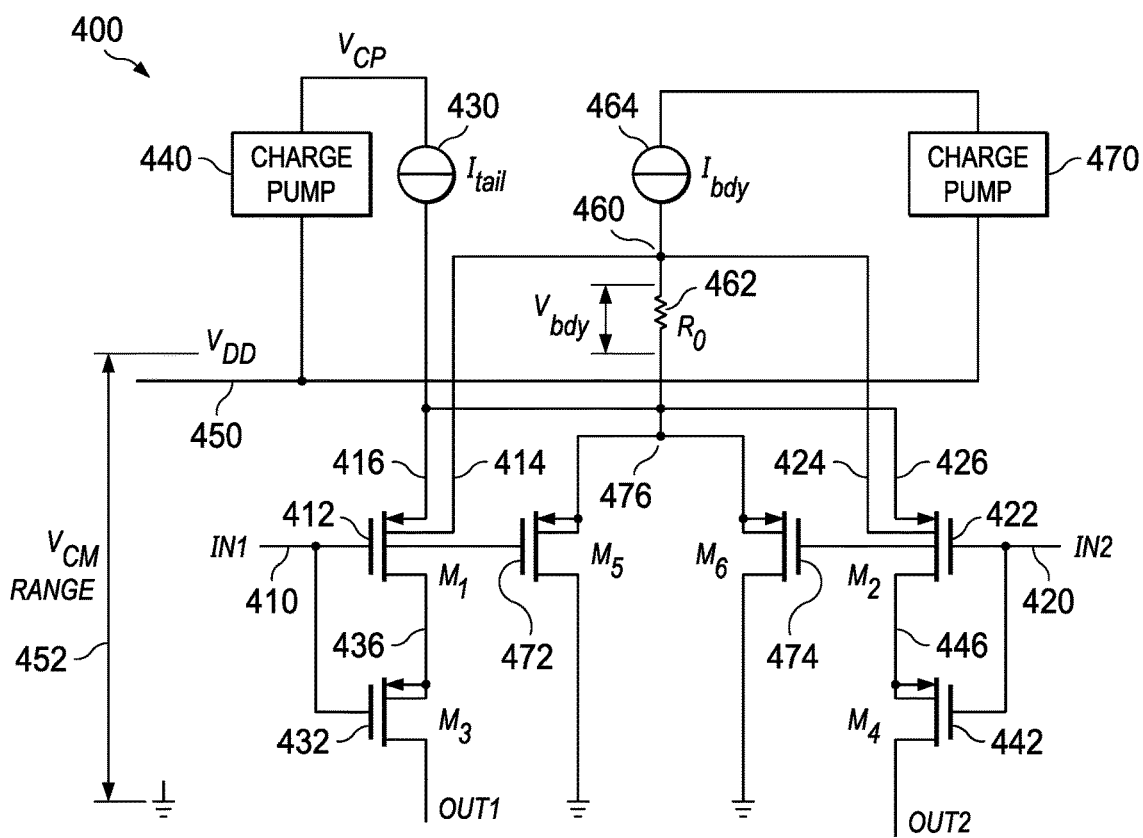
FIG. 4 shows an operational amplifier operating in differential mode with a body bias voltage supplied by a separate charge pump.

FIG. 4 shows an input stage 400 for an operational amplifier operating in differential mode with a body bias voltage supplied by a separate charge pump. IN1 410 and IN2 420 are inputs for a differential amplifier. IN1 410 is a gate input for transistor M1 412 and IN2 420 is a gate input for transistor M2 422. The body 414 of transistor M1 412 is coupled to the body 424 of transistor M2 422. The bodies 414 and 424 are also coupled to a $V_{bdy}$ terminal 460 that provides a bias voltage for the body 414 of transistor M1 412 and the body 424 of transistor M2 422.

The voltage at $V_{bdy}$ terminal 460 is generated by injecting current from $I_{bdy}$ current source 464 through resistor 462. The current from $I_{bdy}$ 464 is supplied by charge pump 470, which is supplied by $V_{DD}$ 450. The other terminal of resistor 462 is coupled to the source terminal 476 of transistors M5 472 and M6 474. The gate terminal of M5 472 is coupled to IN1 410. The gate terminal of M6 474 is coupled to IN2. The drain terminals of M5 472 and M6 474 are coupled to the lower supply rail, which could be ground or could be a negative supply voltage.

The source 416 of M1 412 is coupled to the source 426 of M2 422. The source 416 of M1 412 and the source 426 of M2 422 are coupled to a current source 430, which provides current necessary for biasing transistors M1 412 and M2 422 to ensure they remain operating in the saturation region. The current source 430 is fed by a charge pump 440 that is supplied by a voltage source $V_{DD}$ 450. The charge pump 440 is necessary because the current source 430 requires a voltage higher than $V_{DD}$ 450 in order to support a common mode voltage range outside the upper and lower rail voltages. The charge pump 440 outputs a voltage $V_{CP}$ that could in some cases be around 200 mV higher than the gate to source voltage, $V_{GS}$, of M1 412. In other cases, the output voltage $V_{CP}$ of the charge pump 440 could be anywhere in a range from 50 mV to 500 mV higher than $V_{GS}$ of M1 412

The drain 436 of M1 412 is coupled to the source of transistor M3 432. The gates of M1 412 and M3 432 are coupled to each other and are also coupled to amplifier input IN1 410. Similarly, the drain 446 of M2 422 is coupled to the source of transistor M4 442. The gates of M2 422 and M4 442 are coupled to each other and are also coupled to amplifier input IN2 420. The drain of M3 432 is coupled to output terminal OUT1 and the drain of M4 442 is coupled to output terminal OUT2. The bodies of M3 432 and M4 442 are coupled to their respective sources, 436 and 446, so M3 432 and M4 442 are said to be connected locally. In at least one embodiment, the bodies of M5 472 and M6 474 are connected locally. In another embodiment, the bodies of M5 472 and M6 474 are coupled to $V_{bdy}$ terminal 460.

The circuit of FIG. 4 operates in a manner similar to FIG. 3 in that M3 432 must turn on before M1 412 and M4 442 must turn on before M2 422 in order to ensure that M1 412 and M2 422 always operate in the saturation region. It is ensured that M3 and M4 will turn on before M1 and M2, respectively, because M3 and M4 are connected locally while M1 and M2 have a bias voltage between their respective source and body. Having a bias voltage between the source and body employs the body effect to increase the threshold voltage of M1 412 and M2 422, thus ensuring that they will turn on after M3 432 and M4 442 which each have their source and body connected.

For the purposes of this disclosure, if an element is referred to as being "coupled" to another element, it may be directly coupled to the other element, or intervening elements may exist. If an element is referred to as being "directly coupled" to another element, no other intervening elements are intentionally disposed. The terms "substantially the same," "substantially equal," and "approximately the same" describe a quantitative relationship between two objects. This quantitative relationship may prefer the two objects to be equal by design but with the anticipation that a certain amount of variations can be introduced by the fabrication process.

While operations are depicted in the drawings in a particular order, this should not be understood as requiring that all illustrated operations be performed to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An apparatus comprising:
   a bias voltage generator;
   a current source;
   a first transistor having a first gate, a first source, a first drain, and a first substrate;
      in which the first gate is coupled to a first input terminal;
      in which the first source is coupled to the current source; and
      in which the first substrate is coupled to a bias voltage terminal of the bias voltage generator;
   a second transistor having a second gate, a second source, a second drain, and a second body;
      in which the second gate is coupled to the first input terminal;
      in which the second source is coupled to the first drain;
      in which the second drain is coupled to a first output terminal; and
      in which the second substrate is coupled to the second source;
   a third transistor having a third gate, a third source, a third drain, and a third substrate;
      in which the third gate is coupled to a second input terminal;
      in which the third source is coupled to the current source; and
      in which the third substrate is coupled to the bias voltage terminal of the bias voltage generator;
   a fourth transistor having a fourth gate, a fourth source, a fourth drain, and a fourth substrate;
      in which the fourth gate is coupled to the second input terminal;
      in which the fourth source is coupled to the third drain;
      in which the fourth drain is coupled to a second output terminal; and
      in which the fourth substrate is coupled to the fourth source; and
   a charge pump coupled to the current source and to a supply voltage, the charge pump configured to generate a higher voltage than the voltage of the supply voltage,
   wherein the bias voltage generator is configured to generate a bias voltage that is applied between the first substrate and the first source of the first transistor and between the third substrate and the third source of the third transistor.

2. The apparatus of claim 1, in which the charge pump is a first charge pump and the bias voltage generator includes a second charge pump.

3. The apparatus of claim 2, in which the current source is a first current source, and the bias voltage generator includes a second current source that injects current through a resistor to generate the voltage at the bias voltage terminal.

4. The apparatus of claim 3, in which the second charge pump generates a voltage that is higher than the voltage of the voltage supply.

5. The apparatus of claim 4, additionally comprising:
   a fifth transistor having a fifth gate, a fifth source, a fifth drain, and a fifth substrate;
      in which the fifth gate is coupled to the first input terminal;
      in which the fifth source is coupled to the resistor at a terminal opposite from the second current source; and
      in which the fifth substrate is coupled to the fifth source; and
   a sixth transistor having a sixth gate, a sixth source, a sixth drain, and a sixth substrate;
      in which the sixth gate is coupled to the second input terminal;
      in which the sixth source is coupled to the fifth source; and
      in which the sixth substrate is coupled to the sixth source.

6. The apparatus of claim 5, in which the fifth substrate and the sixth substrate are coupled to the bias voltage terminal.

7. The apparatus of claim 1, in which the first input terminal and the second input terminal form input terminals of an operational amplifier.

8. The apparatus of claim 3, in which the resistance of the resistor is chosen to provide the first transistor with a higher threshold voltage than the second transistor, and to provide the third transistor with a higher threshold voltage than the fourth transistor.

9. The apparatus of claim 3, in which the resistance of the resistor is chosen to cause the second transistor to turn on before the first transistor, and to cause the fourth transistor to turn on before the third transistor.

10. An apparatus comprising:
    a bias voltage source;
    a current source;
    a first transistor having a first gate, a first source, a first drain, and a first substrate;
       in which the first gate is coupled to a first input terminal;
       in which the first source is coupled to the current source and to a first terminal of the bias voltage source; and
       in which the first substrate is coupled to a second terminal of the bias voltage source;
    a second transistor having a second gate, a second source, a second drain, and a second substrate;
       in which the second gate is coupled to the first input terminal;
       in which the second source is coupled to the first drain;
       in which the second drain is coupled to a first output terminal; and
       in which the second substrate is coupled to the second source;
    a third transistor having a third gate, a third source, a third drain, and a third substrate;
       in which the third gate is coupled to a second input terminal;
       in which the third source is coupled to the current source and to the first terminal of the bias voltage source; and
       in which the third substrate is coupled to the second terminal of the bias voltage source;
    a fourth transistor having a fourth gate, a fourth source, a fourth drain, and a fourth substrate;
       in which the fourth gate is coupled to the second input terminal;
       in which the fourth source is coupled to the third drain;
       in which the fourth drain is coupled to a second output terminal; and in which the fourth substrate is coupled to the fourth source; and a charge pump coupled to the current source and to a supply voltage to generate a higher voltage than the voltage of the supply voltage, wherein the bias voltage source is configured to generate a bias voltage between the first and second terminals of the bias voltage source.

11. The apparatus of claim 10, in which the current source is a first current source and the charge pump is a first charge pump, and the bias voltage source includes a second current source and a second charge pump coupled to the second current source.

12. The apparatus of claim 10, in which the bias voltage source generates a bias voltage to provide the first transistor with a higher threshold voltage than the second transistor, and to provide the third transistor with a higher threshold voltage than the fourth transistor.

13. The apparatus of claim 10, in which the bias voltage source generates a bias voltage to cause the second transistor to turn on before the first transistor, and to cause the fourth transistor to turn on before the third transistor.

14. A process comprising:

receiving first and second input signals at control terminals of first and second input transistors, respectively;

generating a bias voltage and applying the bias voltage between a substrate and a source terminal of each of the first and second input transistors using a bias voltage source including a first charge pump to increase threshold voltages of each of the first and second input transistors;

applying current from a current source supplied by a second charge pump to source terminals of the first and second input transistors; and generating first and second output signals from drain terminals of first and second output transistors, respectively, the first output transistor being coupled to the first input transistor and the second output transistor being coupled to the second input transistor.

15. The process of claim 14, in which the bias voltage is generated and applied to provide each of the first and second input transistors with a higher threshold voltage than the corresponding coupled output transistor.

16. The process of claim 15, in which the bias voltage generated by the bias voltage source causes the first output transistor to turn on before the first input transistor and causes the second output transistor to turn on before the second input transistor.

17. The process of claim 14, in which the first input signal and the second input signal form a differential input of an amplifier, and the first output signal and the second output signal form a differential output of the amplifier.

18. The process of claim 14, in which the bias voltage is generated by injecting current from another current source supplied by the first charge pump through a resistor, one end of which is coupled to a bias voltage terminal.

19. The process of claim 14, wherein the bias voltage source comprises another current source coupled to the first charge pump, and a resistor across which the bias voltage is generated.

* * * * *